United States Patent
Chamberlin et al.

(10) Patent No.: US 6,784,377 B2
(45) Date of Patent: Aug. 31, 2004

(54) METHOD AND STRUCTURE FOR REPAIRING OR MODIFYING SURFACE CONNECTIONS ON CIRCUIT BOARDS

(75) Inventors: Bruce John Chamberlin, Vestal, NY (US); Mark Kenneth Hoffmeyer, Rochester, MN (US); Wai Mon Ma, Poughkeepsie, NY (US); Arch Nuttall, Hyde Park, NY (US); James R. Stack, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/205,102

(22) Filed: Jul. 25, 2002

(65) Prior Publication Data

US 2002/0179324 A1 Dec. 5, 2002

Related U.S. Application Data

(63) Continuation-in-part of application No. 09/852,998, filed on May 10, 2001, now abandoned.

(51) Int. Cl.⁷ .......................... H01R 12/04; H05K 1/11
(52) U.S. Cl. ...................... 174/265; 174/262
(58) Field of Search ................ 174/258–266, 174/250; 361/792–795, 774–776; 29/850–853; 439/55

(56) References Cited

U.S. PATENT DOCUMENTS

| | | | | |
|---|---|---|---|---|
| 5,290,970 A | * | 3/1994 | Currie | 174/250 |
| 5,596,178 A | * | 1/1997 | Christian | 174/265 |
| 5,809,641 A | | 9/1998 | Crudo et al. | 29/840 |
| 5,890,284 A | | 4/1999 | Chartrand et al. | 29/853 |
| 5,913,687 A | | 6/1999 | Rathburn | 439/66 |
| 5,936,843 A | | 8/1999 | Ohshima et al. | 361/760 |
| 5,940,966 A | | 8/1999 | Fasano et al. | 29/842 |
| 5,955,888 A | | 9/1999 | Frederickson et al. | 324/761 |
| 6,115,912 A | | 9/2000 | Crudo et al. | 29/840 |
| 6,133,629 A | | 10/2000 | Han et al. | 257/698 |
| 6,333,471 B1 | * | 12/2001 | Nojioka | 174/262 |
| 6,443,739 B1 | * | 9/2002 | Currie | 439/55 |

OTHER PUBLICATIONS

IBM Technical Disclosure Bulletin, vol. 23, No. 9, Feb. 1981, Defective Hole Repair/Hermetic Seal, F. H. Sarnacki.
IBM Technical Disclosure Bulletin, vol. 33, No. 1B, Jun. 1990, Printed Circuit Net Repair Utilizing a Coaxial Cable––to–Board Pin Connection, C. R. LeCoz and G. L. Williams.

* cited by examiner

*Primary Examiner*—Luan Thai
*Assistant Examiner*—Tuan Dinh
(74) *Attorney, Agent, or Firm*—William N. Hogg

(57) ABSTRACT

A method to replace an electrical interface on a printed circuit board having a plurality of contact pads on a top surface, the contact pads being connected to conducting material extending through said circuit board. For the contact pad being replaced, drilling a hole through said printed circuit board at that location, and removing any remaining conductor material attached to the contact pad on the top board surface. Providing a replacement conductor/contact pad structure having a generally T-configuration with a stem and a head that completely surrounds the stem, wherein said head has a diameter greater than the diameter of the drilled hole. Inserting the replacement conductor/contact pad into the hole with said stem extending beyond the second surface of the board with the bottom surface of the head being in contact with the first surface of said board. A replacement conductor/contact pad on repaired board is also described.

2 Claims, 3 Drawing Sheets

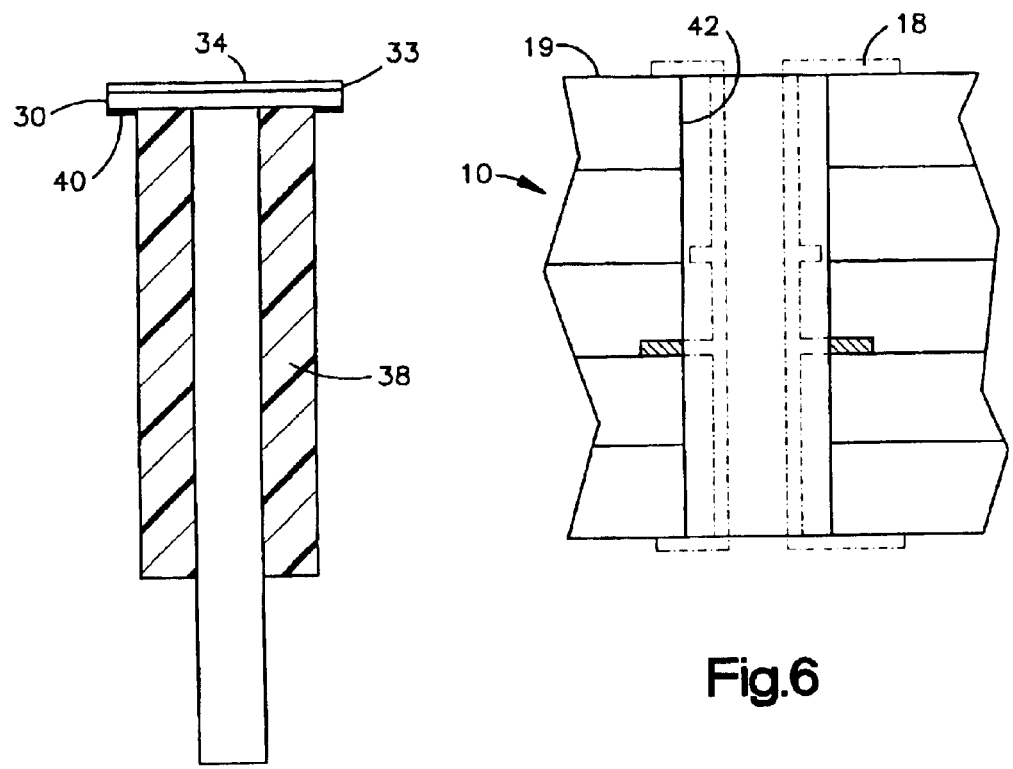
Fig.5
Fig.6
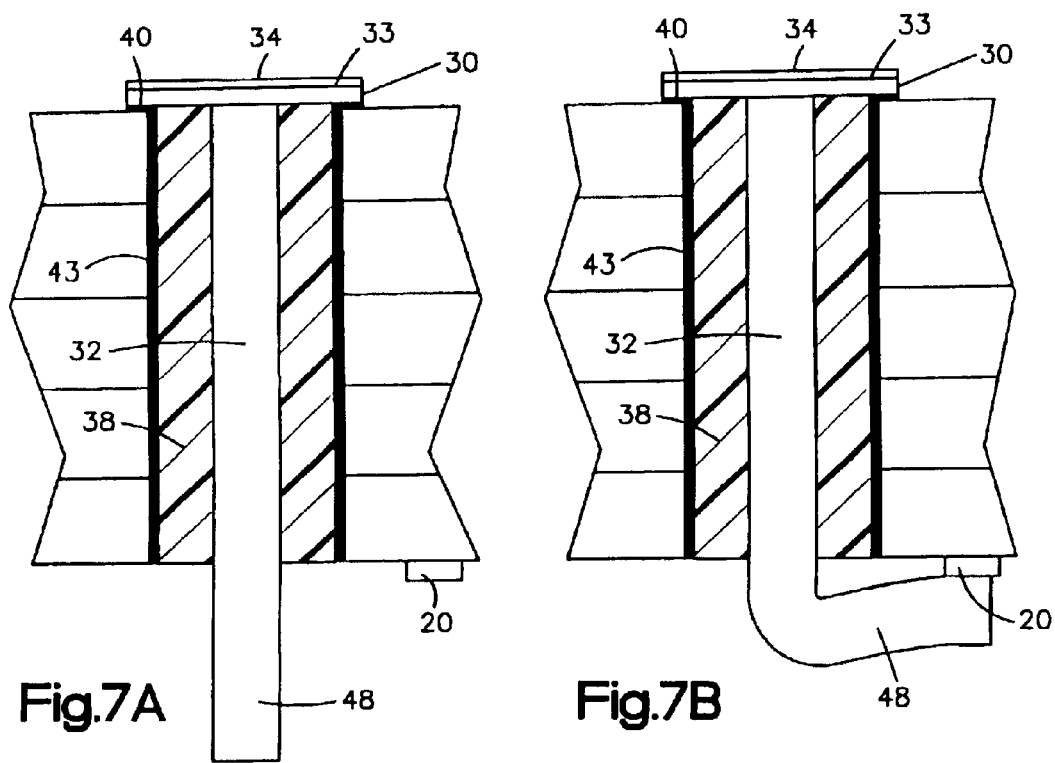
Fig.7A  Fig.7B

METHOD AND STRUCTURE FOR REPAIRING OR MODIFYING SURFACE CONNECTIONS ON CIRCUIT BOARDS

RELATED APPLICATIONS

This application is a continuation-in-part of application Ser. No. 09/852,998, filed May. 10, 2001 now abandoned entitled "LAND GRID ARRAY (LGA) PAD REPAIR STRUCTURE AND METHOD".

BACKGROUND INFORMATION

1. Field of the Invention

This invention relates generally to a method and structure for repairing or making engineering changes to circuit boards having land grid array pads or other electrical interfaces; and, more particularly, to a method and repair structure for replacing individual pads and vias or plated through holes in land grid array or other electrical interface circuit boards having a large number of contact pads and vias.

2. Background Information

Many circuit boards with land grid arrays (LGAs) or other electrical interfaces have a very large number of connections and vias or plated through holes extending from the external connections on one surface of the board to internal wiring, and to wiring and connections on the opposite surface. Indeed, with the present technology, there are up to as many as 41,000 connections, many with associated vias or plated through holes, and this number is increasing as technology advances. In many instances, if a few or even one of these connections is defective, the entire board is defective and the connection and associated via must either be repaired or replaced or the entire board scrapped. Also, the circuit board with an LGA is typically used with an interposer which mounts a module thereon, which module has an integrated circuit chip mounted thereon. Any repair must be transparent to the module and accommodate such a mounting structure. Also, circuit boards having LGAs typically have internal circuitry and the repair must isolate this internal circuitry and provide additional connections to the internal circuitry through topside or bottom side metallurgy.

SUMMARY OF THE INVENTION

The present invention is applicable to different types of surface connections on circuit boards. However, it is especially useful in land grid arrays in which context the present invention will be described, although it is equally useful in other types of circuit boards having surface connections and plated through holes or vias.

According to the present invention, a method of repairing or modifying a land grid array (LGA) interface mounted on a printed circuit board, where the land grid array interface has a plurality of contacts on a first surface of the printed circuit board, and where at least one contact pad is connected to at least one electronic component mounted in or on the printed circuit board by a conductor, is provided. The method includes selecting the contact pad to be replaced and drilling a hole through the printed circuit board at the preselected location, which hole has a diameter sufficient to electrically isolate the preselected contact pad from all circuits contained in or on the printed circuit board. If any of the preselected contact pads or any conductor material directly attached to it remains attached to the board surface, the remaining contact pad or other attached conductor material is delaminated or removed by counterboring an opening, thereby separating the conducting material from the printed circuit board. A preformed replacement conductor/contact pad structure is then installed. The connector/contact pad structure is generally T-shaped and has an enlarged end portion which will serve as the replacement contact pad, having a diameter larger than the diameter of the hole that is drilled. Preferably, the end portion is generally cylindrical in shape, having opposed flat surfaces, one of which is disposed to abut against the first surface of the board, and the other is disposed to provide a contact surface, which preferably is plated with gold. If a counterbore is formed in the board, the end portion is disposed in the counterbore. The end portion is preferably the same structure as the contact pads on the circuit board so it can serve as a replacement contact pad.

The structure also has a stem portion which is disposed to extend into and through the hole drilled in the circuit board at the location of the selected contact pad. The stem portion is longer than the thickness of the circuit board. In one embodiment, a portion of the stem of the structure is encased in a dielectric material which is the same size or just slightly smaller than the diameter of the hole drilled. The structure encased in the dielectric material is then inserted in the hole that has been drilled. Preferably, the encased portion of the stem extends from the head a distance approximately equal to the thickness of the circuit board, or just slightly less, thus leaving a portion of the stem extending there beyond. Therefore, when the structure with the encapsulated stem is inserted in the opening, the dielectric material extends approximately the thickness of the circuit board surrounding the stem portion, thereby isolating the stem portion from any internal structures in the circuit board. The end of the stem extends beyond the bottom of the circuit board and can be bent and attached to any desired structure on the bottom of the circuit board to complete any needed electrical connection. The surface of the conductor/contact pad that abuts the surface of the board is preferably attached thereto by an adhesive.

In another aspect of the present invention, the drilled out hole is filled with a dielectric material and then a smaller hole is drilled into which the stem portion of the structure is inserted, with it extending beyond the bottom of a circuit board. In either case, the preformed conductor contact pad is formed in a T-configuration with the head thereof completely surrounding and extending beyond the stem portion. Moreover, the head has to be larger in diameter than the drilled hole.

Thus, whether the connector contact pad structure is provided encapsulated within a dielectric material and this encapsulated structure inserted in the opening in the circuit board, or whether the opening is filled with a dielectric material and drilled, into which drilled opening the conductor/contact pad structure is inserted, it is essential that the contact pad entirely surround the stem so that the contact pad extends for contact on all sides of the stem, which stem will act as the via replacement. It is preferred that the head be cylindrical and that the stem be cylindrical and centered.

The present invention also contemplates the replacement part for the defective conductor/contact pad and the circuit board so repaired therewith.

DESCRIPTION OF THE DRAWINGS

FIG. 5 is a longitudinal, sectional view of the structure of FIG. 3 having dielectric material encasing a portion of the stem for insertion into a drilled out hole in a land grid array printed circuit board;

FIG. 6 is a longitudinal, sectional view of a hole drilled out and remaining surface conductor removed with the drilled out and removed portions shown in broken outline in a printed circuit board having an LGA structure thereon ready for repair, using the structure of FIG. 5 as a replacement;

FIG. 7a is a longitudinal, sectional view of the structure of FIG. 5 inserted into the opening of FIG. 6 for repair of a land grid array on a printed circuit board;

FIG. 7b is a view similar to FIG. 7a with the end of the stem of the replacement bent and secured to a contact on the underside of the PC board;

DESCRIPTION OF THE PREFERRED EMBODIMENTS

Figure 1:
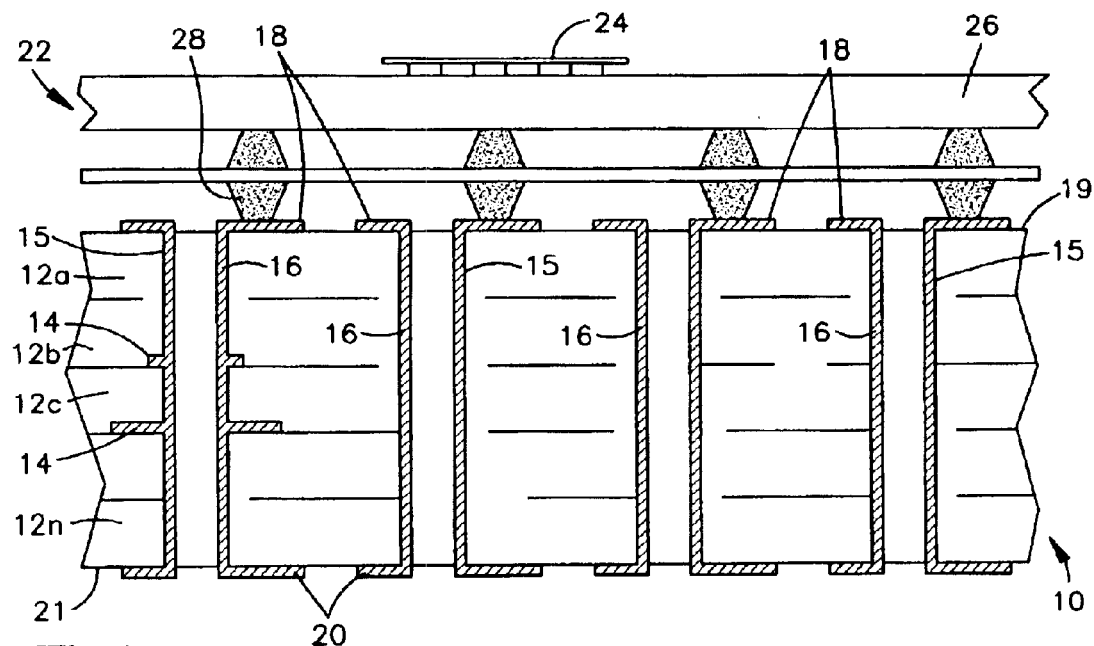
FIG. 1 is a longitudinal, sectional view of a typical printed circuit board (PCB) having a land grid array (LGA) formed thereon.

The preferred embodiment of the present invention will be described in conjunction with a printed circuit board (PCB) having land grid array (LGA) but it is equally useful in other surface-mount structures. Referring now to the drawing and, for the present, to FIG. 1, a longitudinal sectional view of the portion of a typical printed circuit board (PCB) 10 is shown. Typically the PCB 10 is a multi-layer board with layers of dielectric material 12a, 12b, 12c . . . 12n, and has a thickness of from about 0.090" to about 0.180", typically about 0.110". Conductors 14 are formed on the various layers 12 of the PCB 10. The PCB 10 has a plurality of openings 15 which have formed on the sides thereof conductive material forming plated through holes 16. Contacts 18 are provided on the surface 19, the PCB 10 and contacts 20 are provided on surface 21 of the PCB 10. Typically, a module 22 having an I/C chip 24 mounted thereon is secured to the contacts 18 using interposer 26 with solder bumps 28 secured to the contacts 18.

Figure 2:
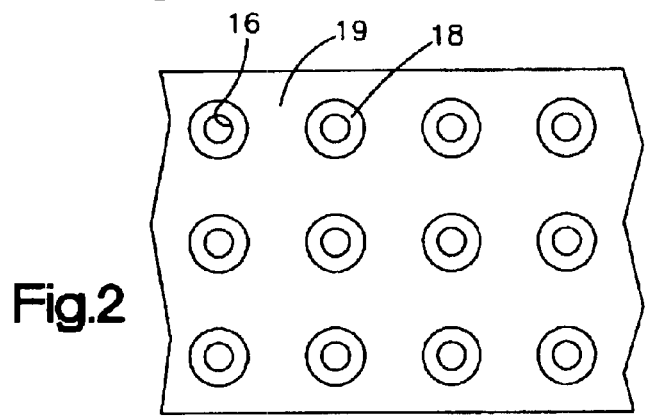
FIG. 2 is a plan view, somewhat diagrammatic, of one configuration of a land grid array.

FIG. 2 is a plan view of one embodiment of a typical LGA having contacts 18 arranged on the surface thereof In one typical embodiment, the LGAs are arranged on one millimeter centers. Typically, the contacts are about 27½ mils in diameter and are formed of gold plated copper, although the plating may be nickel, palladium, or nickel/palladium alloy. Also, typically, they are about 0.002" thick. If any one of these contacts 18 or their associated plated through holes 16 is defective and unable to perform, as indicated above, it must either be replaced or, in many instances, the entire circuit board discarded.

Figures 3, 4:
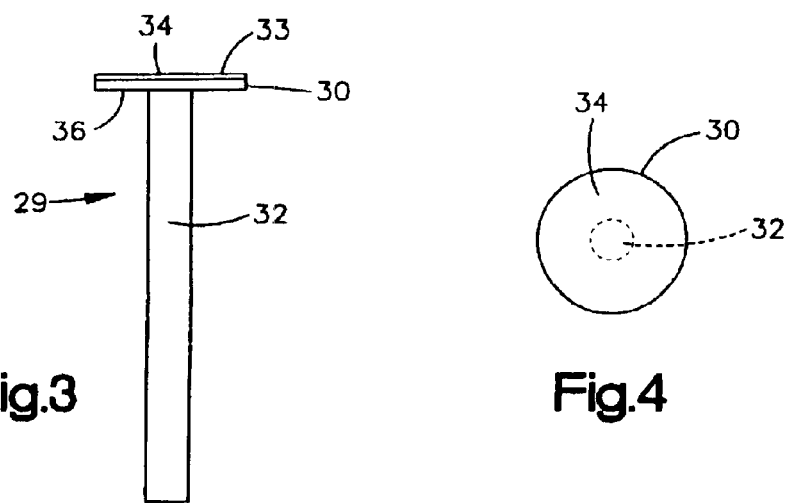
FIG. 3 is a side elevational view of a replacement conductor/contact pad structure having a head section and a stem section.
FIG. 4 is a top plan view of the structure of FIG. 3.

To this end, a repair/replacement conductor/contact pad 29 is provided, one embodiment of which is shown in FIGS. 3 through 5. The conductor/contact pad 29 in the preferred embodiment has a head 30 from which a stem 32 extends. Preferably, both the head 30 and stem 32 are circular in cross-section and the head 30 completely surrounds the stem 32, as can be seen in FIG. 4. The head 30 preferably includes a gold coating 33 thereon, preferably of gold, nickel, palladium or nickel/palladium alloy to improve solderability. Thus, the head has an upper surface 34 and a lower surface 36, the purpose of which will be described presently.

In one embodiment, as shown in FIG. 5, the stem 32 is coated with a dielectric material 38, such as a polyimide sold under the name KAPTON (a trademark of E. I. du Pont de Nemours and Company). A thin coating of adhesive 40 (such as an epoxy) is preferably applied to the surface 36 of the head 30 of the conductor/contact pad structure 19.

The technique for repairing a faulty contact pad or plated through hole (PTH) is depicted in FIGS. 6, 7a, 7b and 8. First, a faulty or defective contact or plated through hole in the printed circuit board 10 and its location are ascertained. Then, at the ascertained location where the conductor or PTH is defective, a hole 42 is drilled completely through all of the layers 12a, 12b, 12c . . . 12n, the conductors 14, of the circuit board 10, as shown in FIG. 6. This drilled hole will completely remove the plated through hole material 16 and a substantial portion of the contact material of the defective contact 18 on the surface 19 and contact 20 on surface 21 of the board 10. Any material of the contact 18 that remains on the surface 19 of the board, and any remaining contact material 20 on surface 21 of the board must be delaminated by conventional means, such as by chiseling it off. Typically, the drilled hole 42 should be about 16 mils in diameter. This can preferably be formed in two drilling operations. The first is a rougher drilling operation of 14 mils, followed by a second finer drilling of about 16 mils. This will remove any conductive material 16 in the plated through hole 15. Also, the diameter of the hole 42 is approximately the same size as, or slightly larger than, the diameter of the dielectric coating 38 on the stem 32. Once the hole 42 has been drilled, the conductor/connector pad assembly as shown in FIG. 5 is inserted into the hole 42, as shown in FIG. 7a. The adhesive 40 will bond to the upper surface 19 of the PCB 10, and the dielectric coating 38 will provide a close fit in the hole 42. Optionally, the coating 38 can have a thin layer of adhesive, such as an epoxy 43 applied thereto. The dielectric coating 38 extends along the stem 32 so that it is approximately flush with, or terminates slightly short of, the surface 21 of the PCB 10. This leaves a tail 48 of the conductor/contact pad assembly extending beyond the bottom of the surface of the PCB, all as shown in FIG. 7a. The tail 48 can be bent and attached to any selected contact 20 on the bottom surface 21 of the PCB so as to complete the necessary connections, as shown in FIG. 7b.

The thickness of the head 30, including the plating 33 thereon, is approximately equal to the thickness of the contacts 18 (about 30 mils) on the surface 19 of the printed circuit board. Also, the diameter of the head 30 is larger than the diameter of the hole 42, typically about 27.5 mils, and, thus, provides an attachment surface or pad for attaching the module 22 thereto.

Figure 8:
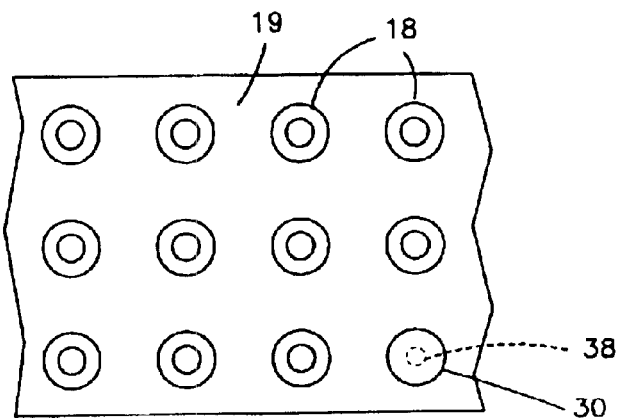
FIG. 8 is a plan view of a circuit board repaired according to this invention.

FIG. 8 shows a top plan view of the LGA as repaired. As can be seen, the diameter of the head 30 is about the same as of the other contacts 18 on the surface providing the required contact surface.

Figure 9:
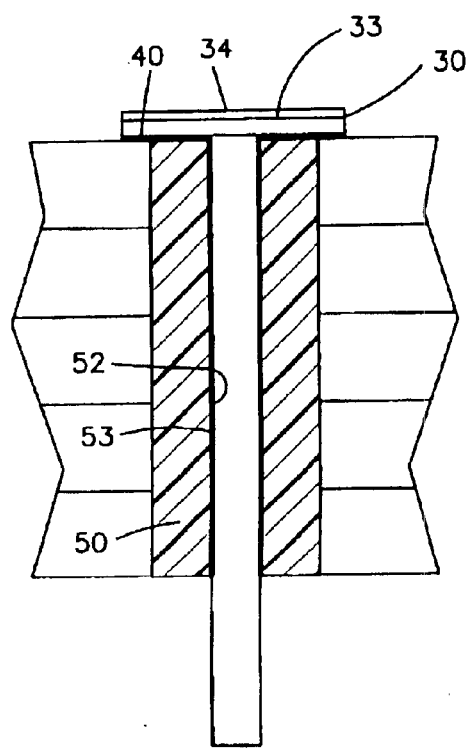
FIG. 9 shows another embodiment using the structure of FIGS. 3 and 4 to repair a circuit board.

FIG. 9 shows another embodiment of the present invention. In this embodiment, instead of the dielectric coating 38 encasing the stem 32 of the conductor/contact pad assembly, a dielectric material 50 is placed in the drilled out hole 42 to fill it, and then a small central hole 52 is drilled, which is approximately the size of the diameter of the original plated through hole 16, i.e., about 10 mils, and, thus, in this embodiment, instead of the conductor/contact pad assembly having the adhesive material 38 formed thereon, a dielectric adhesive material 53 is coated in the hole 52. The conductor/contact pad 29 is then inserted into the adhesive lined hole 52 as shown in FIG. 9. The remainder of the structure and construction is the same.

Figure 10:
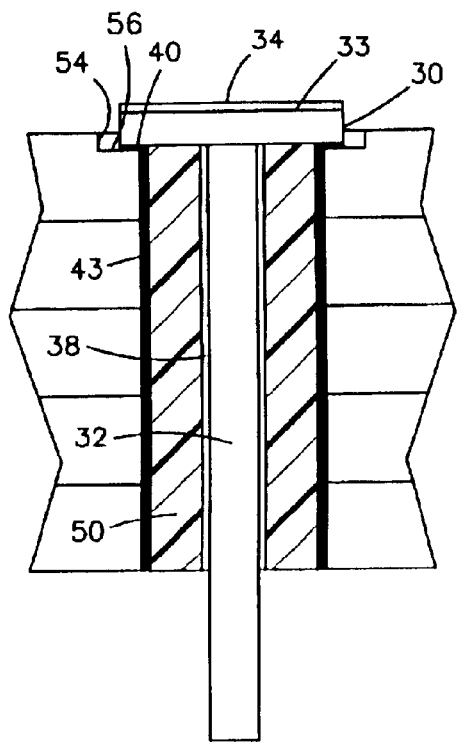
FIG. 10 is yet another embodiment of the invention where the head of the conductor/contact pad is partially contained in a counterbore in the PC board.

FIG. 10 shows a somewhat different embodiment. In this embodiment, there is a countersunk bore or hole 54 formed surrounding the hole 42, which is approximately the diameter of the head 30 or slightly larger (e.g. about 27½ mils) and about 0.005" deep into surface 19 of PC board 10. Thus, the top surface 19 includes a bottom surface 56 of the countersunk hole. In this case, the head 30 of the structure 29 is thicker than the thickness of the contacts 18 (i.e. about 0.002") by 0.005", thus rendering the surface 34 thereof flush with the surface of the contacts 18. This not only provides a recessed setting for the conductor/contact pad structure 29, but also assures the removal of all of the metal of the contact 18 being replaced.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A replacement conductor/contact pad structure to repair or modify a printed circuit board containing a plurality of contact pads, said replacement conductor/contact pad structure being T-shaped and having a head portion and a stem, wherein said head has a plating thereon selected from the group of gold, nickel, palladium or nickel/palladium alloy, and wherein said stem is completely surrounded by said head portion, and said stem is longer than the thickness of the circuit board, said stem being surrounded adjacent said head by a dielectric material extending in contact with said stem less than the length of the stem portion.

2. A printed circuit board comprising at least one layer of dielectric material and having a first surface and a second surface, and having a plurality of contact pads mounted on a first surface thereof, and wherein at least one of said contact pads is connected by a connector to at least one electrical component mounted on at least one of the layers of dielectric material by a plated through hole or via, and wherein said plated through hole has been modified by drilling an opening between said first surface and said second surface having a diameter sufficient to electrically isolate a corresponding one of the contact pads from said electrical component, a preformed replacement conductor/contact pad structure disposed in said opening, said preformed contact pad structure having a flat head and a stem, said head having a diameter larger than the diameter of the hole and said stem extending beyond the second surface of the printed circuit board, and a contact surface of said head portion being in contact with the first surface of said printed circuit board, and wherein a revealed surface of the head of the conductor/contact pad has a plating thereon selected from the group of gold, nickel, palladium or nickel/palladium alloy.

* * * * *